(12) United States Patent
Filseth et al.

(10) Patent No.: US 6,701,511 B1
(45) Date of Patent: Mar. 2, 2004

(54) OPTICAL AND ETCH PROXIMITY CORRECTION

(75) Inventors: Paul G. Filseth, Los Gatos, CA (US); Mario Garza, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 289 days.

(21) Appl. No.: 09/928,471

(22) Filed: Aug. 13, 2001

(51) Int. Cl.[7] .............................................. G06F 17/50
(52) U.S. Cl. ........................................................ 716/19
(58) Field of Search ............................................ 716/19

(56) References Cited

U.S. PATENT DOCUMENTS 6,221,539 B1 * 4/2001 Kotani et al. ................... 430/5
6,335,981 B1 * 1/2002 Harazaki ...................... 382/144
6,370,679 B1 * 4/2002 Chang et al. .................. 716/19
6,425,117 B1 * 7/2002 Pasch et al. ................... 716/21
6,453,274 B2 * 9/2002 Kamon ............................ 703/2
6,458,610 B1 * 10/2002 Lensing et al. ................ 438/16
6,571,383 B1 * 5/2003 Butt et al. ..................... 716/19
6,578,188 B1 * 6/2003 Pang et al. .................... 716/19
6,581,202 B1 * 6/2003 Tourne et al. ................. 716/20

* cited by examiner

Primary Examiner—Stacy A Whitmore
(74) Attorney, Agent, or Firm—Luedeka, Neely & Graham PC

(57) ABSTRACT

A method for adjusting preliminary feature position characteristics of a preliminary mask pattern on a mask to produce a desired etch pattern on a substrate having desired feature position characteristics.

4 Claims, 1 Drawing Sheet

OPTICAL AND ETCH PROXIMITY CORRECTION

FIELD

This invention relates to the field of integrated circuit fabrication. More particularly, this invention relates to a method of determining and compensating for exposure and etch induced inconsistencies during integrated circuit manufacturing processes.

BACKGROUND

Integrated circuit fabrication techniques typically use a mask to project patterns of electromagnetic radiation onto a layer of photoresist on a substrate. The electromagnetic radiation is typically of a wavelength in the ultra violet band, but may be from another portion of the spectrum. The density of the features defined by projecting the mask pattern onto the photoresist tends to be limited by various distorting characteristics of the mask, the radiation, and the photoresist, such as diffraction, which tend to vary the pattern as it is projected from the mask onto the substrate.

Various techniques have been developed to counteract the effects of these distorting characteristics. One such technique, optical proximity correction, provides distortion compensating patterns throughout the mask. The distortion compensating patterns compensate for the distorting characteristics described above, thereby resulting in the projection of a correct pattern onto the photoresist. By using such optical proximity correction techniques, projected features on the substrate can be smaller and more densely packed.

As implied above, the patterns projected onto the photoresist are subsequently used to mask an underlying layer during an etch step. Unfortunately, additional distortion to the shape of the desired feature occurs during the etch step. This situation tends to further limit the feature density of the integrated circuit, in a manner similar to that as mentioned above. Optical proximity correction techniques, such as described above, tend to not correct the distortion of the desired pattern that occurs during the etch step.

What is needed, therefore, is a system for accounting for the differences between a pattern on a mask and the etched pattern in a layer that is eventually produced by use of the mask.

SUMMARY

The above and other needs are met by a method for adjusting preliminary feature position characteristics of a preliminary mask pattern on a mask to produce a desired etch pattern on a substrate having desired feature position characteristics. The feature positions are adjusted by calculating adjustment distances based on the numbers in a table. Prior to adjusting preliminary mask features, the table is computed, based on measurements made of a test pattern etched on a substrate which was previously manufactured by exposing a test mask, or in other words, a mask with the test pattern on it. The feature position characteristics of the test pattern on the test mask are measured at locations on the test mask corresponding to a first set of given locations, to produce a first set of position data.

Test feature position characteristics of a test etch pattern on the substrate are measured at locations on the substrate corresponding to the first set of given locations, to produce a second set of position data. The test etch pattern is produced through use of the test mask pattern. A first database of differences between pairs of the first set of position data and the second set of position data is computed, where the pairs are associated by similar locations in the first set of given locations.

A third set of position data corresponding to the first set of given locations from a target contour of an aerial simulation of anticipated intensity values is generated from the test mask pattern on the test mask. A second database of differences between pairs of the first set of position data and the third set of position data is computed, where the pairs are associated by similar locations in the first set of given locations.

A transformation is generated, where inputs to the transformation correspond to the third set of position data and outputs from the transformation correspond with values of the first database and the second database.

The feature position characteristics of the preliminary pattern on the preliminary mask are measured at locations on the preliminary mask corresponding to a second set of given locations, to produce a fourth set of position data. This fourth set is iteratively adjusted and input to the transformation until the output of the transformation produces adjustment values for producing the desired etch pattern. The preliminary feature position characteristics of the preliminary mask pattern of the mask are adjusted by the adjustment values to produce a compensated mask pattern that produces the desired etch pattern on the substrate having the desired feature position characteristics.

In this manner, the discrepancies between a test pattern in a mask and the test pattern as etched into a substrate can be used to set a correlation, or in other words the transformation, that can be used with other mask patterns to adjust the mask pattern so as to produce etched features in the substrate that have the desired feature position characteristics. In other words, the transformation can be used with a conventional optical proximity correction program calibrated to the target contour of the aerial image of any mask pattern to produce adjustments to the mask pattern that will tend to produce the desired pattern in the etched substrate.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
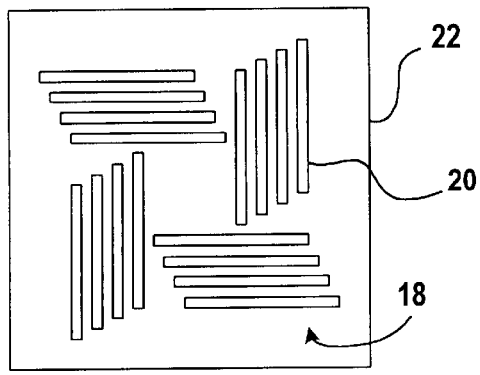
FIG. 1 is a top plan view of a test pattern on a mask.

In accordance with a preferred embodiment of the invention, and with reference to FIG. 1, there is provided a mask 22 having a test pattern 18. It is appreciated that the test pattern 18 can be fashioned in a number of different configurations, and the particular test patterns discussed herein are not intended to limit the invention. However, in a most preferred embodiment, as shown in FIG. 1, the test pattern 18 includes a number of bars 20 having varying orientations, lengths, widths, and spacing.

It is preferred that at least some of the bars 20 of the test pattern 18 be oriented horizontally, and at least some of the bars 20 of the test pattern 18 be oriented vertically. Further, some of the bars 20 are preferably disposed into groups of parallel bars 20. At least some of these groups of parallel horizontally oriented bars 20 and parallel vertically oriented bars 20 are preferably in proximity one to the other, with the ends of the bars 20 of one group spaced at different distances from the lengths of the bars 20 of another group, as depicted in FIG. 1.

Figure 2:
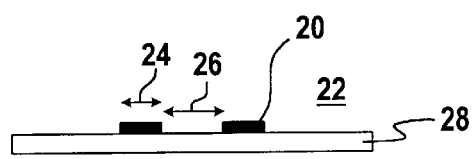
FIG. 2 is a cross sectional view of the test pattern on the mask.

FIG. 2 depicts a cross sectional view of the mask 22. The mask 22 preferably includes a substrate 28 that is substantially transparent to the radiation used in association with the mask 22. Disposed on the mask substrate 28 are deposits that are substantially opaque to the radiation used in association with the mask 22. The deposits form the pattern 18 of the mask 22, such as the bars 20.

Figure 3:
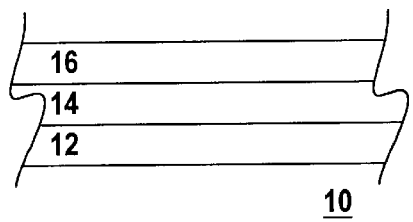
FIG. 3 is a cross sectional view of a substrate.

Referring now to FIG. 3, there is depicted a cross sectional view of a substrate 10. In the example depicted, the substrate 10 includes an underlying layer 12, a pattern layer 14 overlying the underlying layer 12, and a photoresist layer 16 overlying the underlying layer 12 and pattern layer 14. It is appreciated that the substrate 10 can include more layers or fewer layers, and is modified according to the desired application. The invention as described herein is not limited by the different materials of which the various layers of the substrate 10 may be formed.

The substrate 10 is preferably brought into proximity with the mask 22, and aligned with the mask 22. The radiation is then directed through the mask 22 to expose portions of the photoresist layer 16 on the substrate 10. After various subsequent processing, such as developing the photoresist layer 16, the photoresist layer 16 is patterned with voids in a configuration that is dependent at least in part on the pattern 18 of the mask 22, as depicted in cross section in FIG. 4.

It is appreciated that a specific combination of mask 22 and photoresist layer 16 has been selected to explain the preferred embodiments of the invention disclosed herein. For example, as depicted in the figures the photoresist layer 16 is a negative photoresist, and the bars 20 of the pattern 18 are transferred as to the substrate 10 as the voids 30 within the photoresist layer 16. In alternate embodiments, the photoresist layer 16 may be a positive photoresist. In yet other embodiments, the bars 20 of the pattern 18 are configured so as to be patterned in the photoresist layer 16 as portions of the photoresist layer 16 that remain on the substrate 10 after developing, rather than being developed away to form the voids 30 within the layer of the photoresist layer 16.

Figure 5:
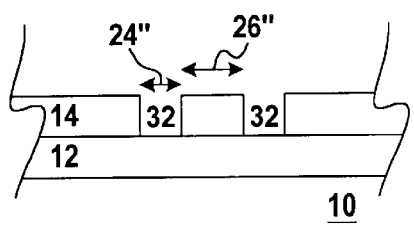
FIG. 5 is a cross sectional view of the test pattern etched into the substrate.

As depicted in cross section in FIG. 5, the patterned photoresist layer 16 masks the pattern layer 14 during an etch step, wherein voids 32 are etched into the pattern layer 14. After the etching step, the photoresist layer 16 is preferably removed from the substrate 10.

The bars 20 on the mask 22 are preferably created with known widths 24 and spacing 26. However, due to the issues as briefly discussed above, the voids 30 in the photoresist layer 16 are formed with somewhat different widths 24' and spacing 26'. Further, the voids 32 in the pattern layer 14 are formed with widths 24" that tend to be different from the widths 24 and 24', and spacing 26" that tend to be different from the spacing 26 and 26'. Thus, the present invention provides a method to compensate for the dimensional differences between the pattern 18 of the pattern layer 14 and the pattern 18 of the mask 22.

The various dimensions of the pattern 18 on the mask 22 are measured. For example, the widths 24 of the bars 20 are measured at many different places in the pattern 18. Preferably, the spacing 26 between the bars 20 of the pattern 18 on the mask 22 are also measured at many different places in the pattern 18. Most preferably, the spacing 26 between the ends of the horizontal sets of bars 20 and the edges of the vertical sets of bars 20 are all measured and recorded. Other dimensions of the pattern 18 may also be measured, such as the lengths of the bars 20.

The various dimensions of the pattern 18 as etched into substrate 10, such as depicted in FIG. 5, are also measured. For example, and in a similar manner as described above for the mask 22, the widths 24" of the voids 32 are measured at many different places in the pattern 18. Preferably, the spacing 26" between the voids 32 of the pattern 18 on the substrate 10 are also measured at many different place in the pattern 18. Most preferably, the spacing 26" between the ends of the horizontal sets of voids 32 and the edges of the vertical sets of voids 32, as transferred from the mask 22, are all measured and recorded. Other dimensions of the pattern 18 as etched on the substrate 10 may also be measured, such as the lengths of the voids 32.

Most preferably, the measurements from the mask 22 and the measurements from the substrate 10 are taken in the same relative positions on both the mask 22 and the substrate 10. In other words, the two data sets can be compared to determine the different measurements for a given feature of the pattern 18 on both the mask 22 and the substrate 10, whether that feature be a length, width, or spacing associated with a given bar 20 and its associated void 32.

A database is created using the measurements of the pattern 18 from the mask 22 and the measurements of the pattern 18 from the substrate 10, as described above. For example, suppose that an edge of a feature in the pattern 18 of the mask 22 is located at a position designated as $x_1$, $y_1$, but the edge of associated feature in the pattern 18 of the etched substrate 10 is located at a position designated as $x_2$, $y_2$. The difference between the two position designations for the feature is given as $(x_2-x_1, y_2-y_1)$, and is called the discrepancy between the mask 22 feature edge location and the substrate 10 feature edge location. The discrepancy $(x_2-x_1, y_2-y_1)$ for each location is preferably termed a FI value. The FI value for the feature is preferably stored in a FI database.

All of the associated pairs of measurements for the feature locations on the mask 22 and substrate 10 are preferably compared and a FI value determined and stored in the FI database as given above. As described above, the FI value is computed by subtracting the mask 22 position from the substrate 10 position. It is appreciated that the FI value could also be computed by subtracting the substrate 10 position from the mask 22 position. It is further appreciated that similar computations, as given below, could also be reversed from the order as explained, in a manner similar to that as described above, so long as the relative differences are tracked and adjustments are made in a proper direction as finally computed.

An aerial image is generated from the pattern 18 of the mask 22 using a aerial image simulator. The aerial image simulator is preferably a software algorithm that calculates the effects of diffraction, such as the diffraction of the radiation that is projected through the mask 22 to expose the photoresist layer 16. The design of the mask 22, such as the measurements of the various features of the pattern 18 of the mask 22 as described above, is the input data for the aerial image simulator. Using the mask 22 input data, the aerial image simulator generates an aerial image table, which includes the anticipated intensity of the radiation at various positions as projected on the substrate 10.

The aerial image can be constructed as an actual coordinate plot of the anticipated intensity, such as in a contour map. The anticipated intensity of the radiation in various positions on the substrate 10 may be read from the aerial image, such as by following the contour lines in the aerial image. A contour line is, for example, a contiguous line of points having an anticipated radiation intensity that falls within a certain range. For example, all points in a contiguous line that are binned as 0.25.

Figure 4:
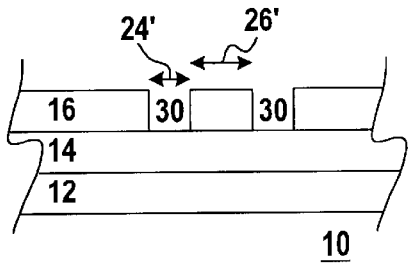
FIG. 4 is a cross sectional view of the test pattern developed onto the substrate.

For a given manufacturing process, such as a given combination of mask 22, radiation source intensity, photoresist layer 16, substrate 10, and other such variables, there is preferably a particular intensity contour line on the aerial image, called the target contour, that corresponds most closely to where the process prints, or in other words to where the pattern 18 actually forms in the exposed and developed photoresist layer 16, such as depicted in FIG. 4. This predicted target contour received from the aerial image simulator is referred to as a pre-etch stage calibration, because it refers to the pattern 18 as printed in the photoresist layer 16, rather than to the pattern 18 as etched in the pattern layer 14.

The aerial image is inspected at the target contour, and measurements are taken of the same features of the pattern 18 in the aerial image as are measured for the mask 22 and the substrate 10, as described above. Thus, there is a first set of data that includes measurements for a set of features as they exist on the mask 22, a second set of data that includes measurements for the same set of features as they exist in the etched pattern 18 of the substrate 10, and a third set of data that includes measurements for the same set of features as they exist in the aerial image.

As described above, the first and second data sets are used to form a FI database. In a manner similar to that as described for forming the FI database, the first and third data sets are used to form a DI database of DI values. The DI values are calculated by determining the difference between associated pairs of measurements on the mask 22 and in the aerial image. As described above, it is not particularly important which value is subtracted from which when creating the DI values for the DI database.

However, it is preferred that all DI values be computed in the same manner, one to another, and that the direction of the discrepancy between the measurements on the mask 22 and the measurements of the aerial image be the same direction as that selected for the FI values. For example, as described above, the FI values are computed by subtracting the mask 22 measurements from the substrate 10 measurements. Thus, it is most preferred that the DI values be computed by subtracting the mask 22 measurements from the aerial image measurements.

A transformation table is preferably generated from the FI database and the DI database. It is appreciated that both the FI database and the DI database contain information that correlates with the other. In other words, both the FI database the DI database contain discrepancy data that is associated with various correlated features of the mask 22, the substrate 10, and the aerial image. It is preferred that the third set of data, e.g. spacing and width measurements obtained from the aerial image, are used as the inputs or index values to the transformation table. The indexed variables may have a non-uniform spatial representation, due to the operation of the aerial image simulator. Correspondingly, it is also preferred that the differences between the DI values and the FI values are used as the outputs or data values of the transformation table.

To account for any non-uniform index variable spatial representation, it is preferred to fit a surface to the DI and FI values. For example, a surface can be derived and fit to the DI and FI values using a least-squares method of derivation. Of course, it is appreciated that other derivation techniques are available for surface derivation and the invention is not intended to be limited to any single technique or example discussed herein. Correspondingly, once an adequate surface is fit to the DI and FI values, the surface is used to calculate table entries for uniformly spaced index variables. Thus, by looking up an input or index value in the transformation table, an associated output or data value can be located. It is preferred that new transformation tables are constructed only when the manufacturing process is altered.

Having constructed the transformation table, it is preferred to use the transformation table to obtain information necessary to correct the preliminary mask 22 features, and thereby obtaining the desired feature pattern when using a corrected mask during the manufacturing process. The desired feature pattern is the pattern of features which correspond to desired widths, lengths, spacing, etc., resulting from the etching step of the substrate 10, taking into account any discrepancies introduced during the etching step and as predicted by the aerial image simulator. The transformation table is preferably integrated into the manufacturing process and automated.

Figure 6:
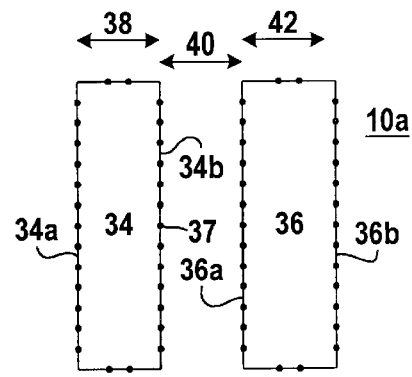
FIG. 6 is a top plan view of a portion of a desired feature pattern on a preliminary mask.

For purposes of more fully explaining the invention, assume for example that the desired feature pattern includes a set of features, including features 34 and 36, as shown in FIG. 6. As discussed above, each feature of the desired feature pattern has desired characteristics such as preferred widths, lengths, spacing etc., for which the transformation table is utilized to provide a corrected mask for creating the desired feature pattern. For the following examples, the generic designation of linear dimensional units is used to delineate the width and spacing values for each feature. It will be appreciated that any particular linear units may be used, with various units being more convenient, dependent at least in part upon the type of electromagnetic radiation used in the process.

For this example, and with continuing reference to FIG. 6, suppose that the desired width 38 of feature 34 is about ten linear dimensional units, and the desired width of feature 36 is about twelve linear dimensional units. That is, the distance from edge 34a to edge 34b is about ten linear dimensional units, and the distance from edge 36a to edge 36b is about twelve linear dimensional units. Further, suppose that the desired space 40 between features 34 and 36 is about ten linear dimensional units. Knowing the desired characteristics of features 34 and 36, the transformation table is used to determine mask feature adjustments required to etch the desired feature pattern. At each point along the desired feature pattern it is preferred that the automated transformation technique first determines a "speculative" transformation. The "speculative" transformation is an educated guess as to the amounts necessary to adjust the mask features in order to obtain the desired feature pattern.

The automated technique, for example, computes the resulting width and space values by adding adjustments geometrically to the positions of the desired features. In this example the desired width/spacing/width is denoted as 10/10/12, corresponding to the desired width between feature edges 34a and 34b, spacing between feature edges 34b and 36a, and the desired width between feature edges 36a and 36b, given above. For this example, the "speculative" transformation of 2/2/2/2 was used, corresponding to the amounts that each feature edge 34a, 34b, 36a, and 36b, is transformed. Accordingly, after the geometric addition, the resulting width and space values are 14/6/16, corresponding to a fourteen linear dimensional unit width between feature edges 34a and 34b, a six linear dimensional unit spacing between feature edges 34b and 36a, and a sixteen linear dimensional unit width between feature edges 36a and 36b.

The resulting width and space values are used as inputs to the transformation table, returning for this example, an output of 4/2/1/3, corresponding to the 14/6/16 width/spacing/width input. The transformation table is used as follows: the first output number, 4, comes from the first width input, 14, the second output number, 2, comes from the first width/spacing pair input, 14/6, the third output number, 1, comes from the second width spacing pair input, 6/16, and the fourth output number, 3, comes from the final width input, 16. Since the "speculative" transformation was 2/2/2/2, it is now known that two speculations were too small, one speculation was optimum and one speculation was too large. The automated process then reiterates using a different "speculative" transformation using the last result output from the transformation table, i.e. 4/2/1/3. Again, after the geometric addition, the resulting width and space values are 16/7/16, corresponding to a sixteen linear dimensional unit width between feature edges 34a and 34b, a seven linear dimensional unit spacing between feature edges 34b and 36a, and a sixteen linear dimensional unit width between feature edges 36a and 36b.

The automated process again uses the resulting width and space values as inputs to the transformation table, generating an output of 3/1/1/3, corresponding to the 16/7/16 width/spacing/width input. Since the last "speculative" transformation was 4/2/1/3, it is now known that two of the speculations were too large, while the other speculations were optimal. Again, after the geometric addition, the resulting width and space values are 14/8/16, corresponding to a fourteen linear dimensional unit width between feature edges 34a and 34b, an eight linear dimensional unit spacing between feature edges 34b and 36a, and a sixteen linear dimensional unit width between feature edges 36a and 36b. The automated process once again uses the resulting width and space values as inputs to the transformation table, generating an output of 3/1/1/3, corresponding to the 14/8/16 width/spacing/width input. Since the last "speculative" transformation was 3/1/1/3, the automated process determines that the transformation is now optimized, or has converged to the optimal solution for the compensated mask pattern.

Having determined the optimum transformation, the resulting optimization can be used as input to a conventional optical proximity correction program, which has been calibrated to the DI values. The optical proximity correction program uses the adjusted design to construct a mask 22a having features corresponding to the proper configuration used to manufacture the desired features on a substrate 10a. The resulting mask 22a can then be used during the manufacturing process, producing the desired feature pattern on the substrate 10a, accounting for any amount of skew introduced by the diffraction and etching phenomena. However, most preferably an adjustment to the mask 22a is not made at points that are close to the corners of the features on the mask 22a. One reason for this is that the corners of the features on the mask 22a are specially compensated during optical proximity correction procedures, and it is desired that this process not interfere with those corrections. It will be appreciated that the example given above is but illustrative of one particular transformation and it is readily appreciated that other possibilities exist for correcting the mask features.

Thus, at the end of this procedure as described above, the features on the mask 22a are adjusted according to the automated correcting process using the transformation table, which moves the location of a feature edge at the referenced position either into the feature or away from the feature by a distance equal to the converged output from the transformation table, preferably in a direction that is at a right angle to edge of the feature at that position. By doing so, the features of the mask 22a are compensated for the shift in the characteristics of the features, such as width, length, and spacing, that occurs when the features are etched into the pattern layer 14 of the substrate 10a. The direction of movement of the edge of the feature is determined by whether the converged output is negative or positive, as further referenced by which of the values was subtracted from the other when computing the DI and FI discrepancy data.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for adjusting preliminary feature position characteristics of a preliminary mask pattern on a mask to produce a desired etch pattern on a substrate having desired feature position characteristics, the method comprising:

measuring test feature position characteristics of a test mask pattern on a test mask at locations on the test mask corresponding to a first set of given locations, to produce a first set of position data, measuring test feature position characteristics of a test etch pattern on the substrate at locations on the substrate corresponding to the first set of given locations, where the test etch pattern is produced through use of the test mask pattern, to produce a second set of position data, computing a first database of differences between pairs of the first set of position data and the second set of position data, where the pairs are associated by similar locations in the first set of given locations, generating a third set of position data corresponding to the first set of given locations from a target contour of an aerial simulation of anticipated intensity values generated for the test mask pattern on the test mask, computing a second database of differences between pairs of the first set of position data and the third set of position data, where the pairs are associated by similar locations in the first set of given locations, generating a transformation, where inputs to the transformation correspond to the third set of position data and outputs from the transformation correspond with values of the first database and of the second database, measuring the preliminary feature position characteristics of the preliminary mask pattern on the mask at locations on the mask corresponding to a second set of given locations to produce a fourth set of position data, iteratively adjusting the fourth set of data and inputting the fourth set of data to the transformation until the output of the transformation produces adjustment values for producing the desired etch pattern, and adjusting the preliminary feature position characteristics of the preliminary mask pattern of the mask by the adjustment values to produce a compensated mask pattern that produces the desired etch pattern on the substrate having the desired feature position characteristics.

2. The method of claim 1 wherein the output of the transformation corresponds with differences between the values of the first database and the values of the second database.

3. The method of claim 1 wherein the first set of given locations is substantially the second set of given locations.

4. The method of claim 1 wherein the preliminary feature position characteristics and the desired feature position characteristics include at least feature width, feature length, and feature spacing.

* * * * *